United States Patent
Emberling

(10) Patent No.: US 7,184,508 B2
(45) Date of Patent: Feb. 27, 2007

(54) CAPTURING DATA AND CROSSING CLOCK DOMAINS IN THE ABSENCE OF A FREE-RUNNING SOURCE CLOCK

(75) Inventor: Brian D. Emberling, San Mateo, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 835 days.

(21) Appl. No.: 10/327,727

(22) Filed: Dec. 23, 2002

(65) Prior Publication Data
US 2004/0120442 A1 Jun. 24, 2004

(51) Int. Cl.
*H04L 7/00* (2006.01)
(52) U.S. Cl. .................... 375/372; 711/111
(58) Field of Classification Search ........ 375/371–372; 365/230.08, 233, 233.5; 711/105, 111, 100, 711/147, 152, 167, 201
See application file for complete search history.

(56) References Cited

U.S. PATENT DOCUMENTS 6,330,645 B1 * 12/2001 Harriman .................. 711/151
6,603,706 B1 * 8/2003 Nystuen et al. ............. 365/233
6,819,730 B2 * 11/2004 He ........................... 375/376
6,918,016 B1 * 7/2005 Magro ...................... 711/154
2004/0012577 A1  1/2004 Naegle et al.

* cited by examiner

*Primary Examiner*—Khanh Tran
(74) *Attorney, Agent, or Firm*—Meyertons Hood Kivlin Kowert & Goetzel, P.C.; Jeffrey C. Hood

(57) ABSTRACT

Data, such as data received by a memory I/O from a memory unit in a DDR SDRAM system, is captured using a trigger signal, which may be a non free-running clock signal such as a DQS signal in a DDR SDRAM system, and is transferred to a host system, which may be part of an ASIC, using the host system's clock. The memory I/O includes a data capture register that latches the data received from the memory unit using DQS. The memory I/O also includes a FIFO buffer that latches the data output by the data capture register using a delayed version of DQS. A single edge of the delayed DQS is available to the FIFO for latching each set of data that corresponds to a single pulse of DQS. The FIFO transfers the data to the host system using the host system's clock, which represents a different clock domain than DQS.

41 Claims, 6 Drawing Sheets

CAPTURING DATA AND CROSSING CLOCK DOMAINS IN THE ABSENCE OF A FREE-RUNNING SOURCE CLOCK

BACKGROUND OF THE INVENTION

1. Field of the Invention

This invention relates generally to the field of digital interface design and, more particularly, to a system for transferring data from one clock domain to another clock domain.

2. Description of the Related Art

The design of interfaces plays a significant role in the implementation of many digital systems. One example of such digital system is a Double Data Rate Synchronous Dynamic Random Access Memory (DDR SDRAM) system. FIG. 1 illustrates a common implementation of a DDR SDRAM system that includes a DDR SDRAM Controller coupled to a DDR SDRAM unit through an interface unit (memory I/O), with the memory I/O coupled to the DDR SDRAM unit through a set of pad circuits. In a DDR SDRAM, read-data is accompanied by a corresponding trigger signal, commonly referred to as a DQS (DQS) signal. DQS is often used by the memory I/O, which may be coupling the DDR SDRAM to an Application Specific Integrated Circuit (ASIC), to sample and latch the read-data.

Generally, once the read-data has been latched inside the Memory I/O, it needs to be transferred to the clock domain of the ASIC. The transferring of the read-data often includes registering or latching the read-data a second time. A second registering or latching of the read-data is many times accomplished using a first-in-first-out (FIFO) buffer. Most systems require a free-running trigger signal or clock signal to latch the data into the FIFO buffer. Therefore, in the case of a DDR SDRAM system, a DQS provided by the DDR SDRAM would have to be free-running. A DQS provided by a DDR SDRAM system, however, is usually not free-running.

A common approach to solving this issue may be to generate a clock running at a frequency commensurate with a frequency of a DQS, and delaying the clock to bring it in phase with DQS. Such design would usually require a phase locked loop (PLL) or a delay locked loop (DLL). A PLL and/or DLL design may be time consuming and in many cases too expansive. Therefore, there exists a need for a simpler system and method for transferring data, such as read-data for a DDR SDRAM, from one clock domain, such as a clock domain of the DDR SDRAM, to another clock domain, such as a clock domain of an ASIC, when a trigger signal, such as a DQS, or clock signal provided with the data for the purpose of registering or latching the data, is not a free-running trigger signal or clock signal, respectively.

SUMMARY OF THE INVENTION

In one set of embodiments the invention comprises a system and method that provides an improved digital interface for transferring data from one clock domain to another clock domain. In one embodiment, the system comprises a memory controller, a memory unit, and a memory I/O unit. The memory controller may be coupled to the memory unit through the memory I/O unit. In one embodiment, the memory I/O unit is embedded on the same integrated circuit as the memory controller.

The memory I/O unit may be configured to receive a read signal from the memory controller, data from the memory unit, and a trigger signal or clock signal, which may be a DQS signal in case of a DDR SDRAM system, corresponding to the read signal, from the memory unit. The trigger signal or clock signal received from the memory unit may be non free-running. The memory I/O may be operable to receive a system clock from the memory controller. In one embodiment, the memory I/O includes a data capture register, which latches the data received from the memory unit using the trigger signal or the clock signal received from the memory unit. The memory I/O may also include a buffer, which may be a FIFO, which is operable to latch the data that is output by the data capture register.

In one embodiment, the FIFO uses a delayed version of a DQS signal to latch the data from the output of the data capture register, and transfers the data to the memory controller using the system clock, which may be free running. In this embodiment, a single edge of the delayed version of the DQS signal is available to the FIFO for latching data corresponding to a single pulse of the DQS signal, from the output of the data capture register.

Thus, various embodiments of the invention may provide a means for capturing data, such as data received from a memory unit, and transferring that data to a host system, which may be part of an ASIC, that operates in a clock domain different from the clock used when first latching the data received from the memory unit, and when the clock used for latching the data the first time is not a free-running clock.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
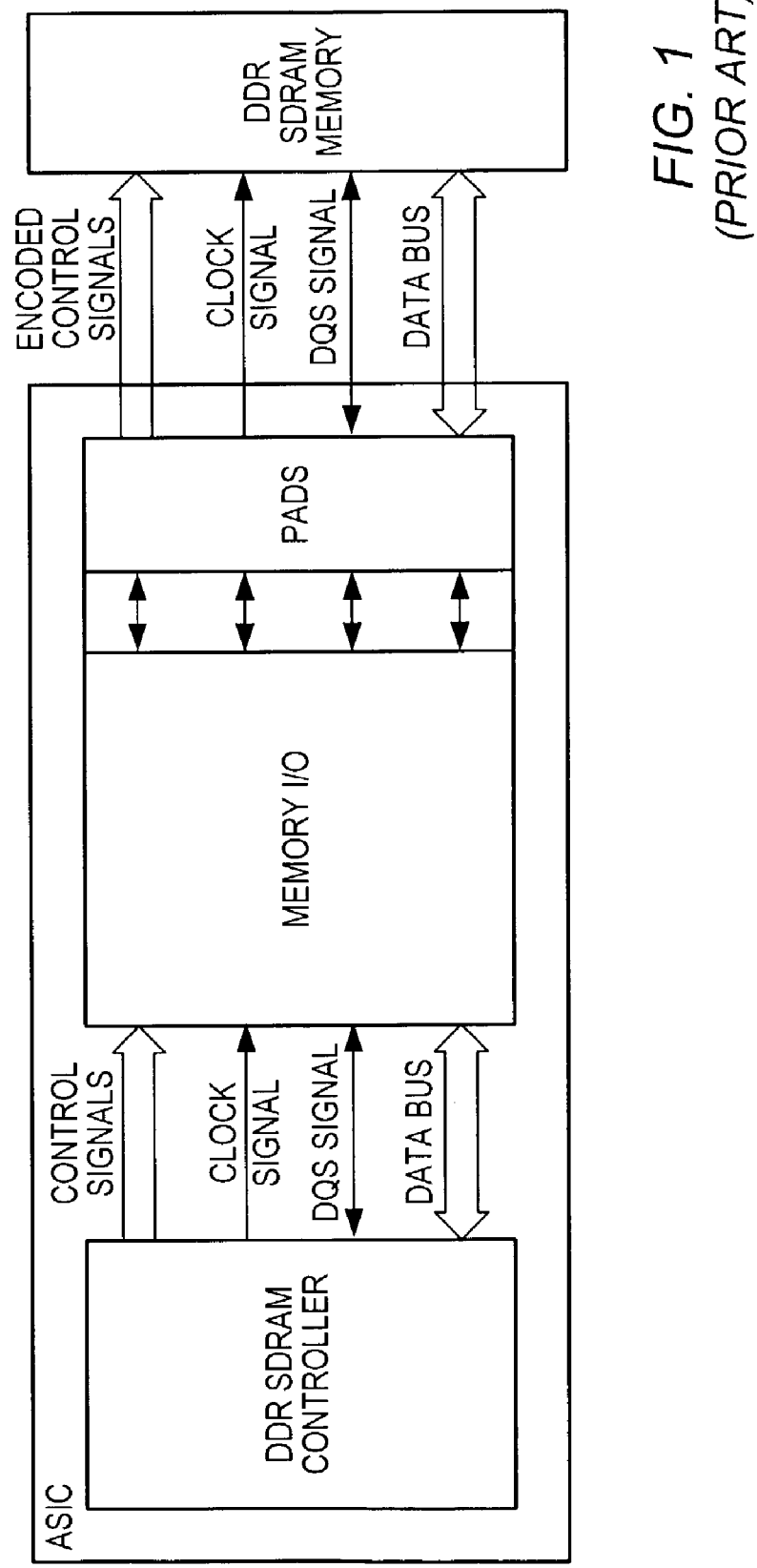
FIG. 1 illustrates one embodiment of a DDR SDRAM system configured on a printed circuit board in accordance with prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, a "trigger" signal is defined as a signal that is used to initiate, or "trigger", an event or a sequence of events in a digital system. A trigger signal is said to be in a "triggering state" at a time when it initiates a desired event, or sequence of events. A periodic trigger signal may commonly be referred to as a "clock". In a "synchronous" digital system, generally a clock, commonly referred to as a "system clock", may be used for initiating most events, or sequences of events. An example of a triggering state may be, but is not limited to, a rising edge of a pulse of a clock in a synchronous digital system. A clock is referred to as a "free-running" clock when the clock is available continuously, without interruption, during operations that require the clock. In other words, a clock is not free-running when it is not available during all operations that require the clock. A "clock domain" of a first host system refers to a frequency and relative phase of a first clock used by the first host system, with reference to a second clock used by a second host system that may be coupled to the first host system. "Transferring data from one clock domain to another clock domain" indicates the process of introducing data originating from a first host system using a first clock, into a second system using a second clock, where the second clock may be of a different frequency than the first clock, and may be out of phase with respect to the first clock.

When an event, or a sequence of events, is said to be initiated "in response to" receiving a stimulus signal, it may be implied that the event, or the sequence of events, is initiated as a result of a combination of a trigger signal, used in triggering the event or sequence of events, being in a triggering state at a time when the stimulus signal is asserted. In one set of embodiments, the sending of a pulse through an output port may indicate a point in time at which a leading edge of the pulse occurs at the output port, and the receiving of a pulse through an input port may indicate a point in time at which a leading edge of the pulse occurs at the input port. The term "latency" is defined as a period of time of finite length. A signal is said to be delayed "by a latency" when a time period normally required for the signal to travel from a source point to a destination point is increased by a time period equivalent to the latency, where the signal is being delayed between the source point and the destination point.

A set of flip-flops is said to be connected in a series when an output of a first flip-flop of the series is coupled to an input of a second flip-flop of the series, and an output of the second flip-flop of the series is coupled to an input of a third flip-flip flop of the series, and so forth until a last flip-flop of the series is reached. Any such series may be comprised of at least one flip-flop. A flip-flop may have a "preset" or "set" input which, when activated, presets an output of the flip-flop to a logic high level. Furthermore, a flip-flop may have a "reset" input which, when activated, resets an output of the flip-flop to a logic low level. The word "FIFO" refers to a first-in first-out buffer, or queue.

Figure 2:
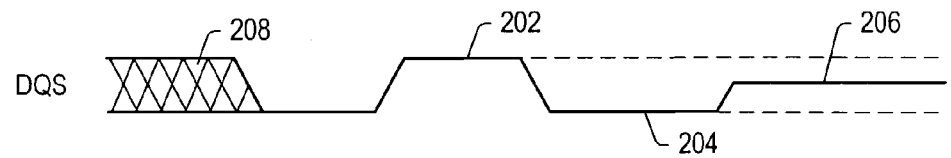
FIG. 2 illustrates a behavior of a DQS signal generated by a DDR SDRAM unit in accordance with prior art.

A "range" of elements or values is defined as an ordered set of the elements or values, the range beginning with the smallest element or value and ending with the largest element or value. A "subset" of a group of elements may include any number of elements from the group, or all elements of the group. Two elements in a set or a range are said to be "adjacent" if the set or range does not contain any other single element that is larger than the first of the two elements and smaller than the second of the two elements. When discussing signals, a "mid-supply level" may refer to a state that represents a level nominally equidistant from a logic high level and logic low level, as illustrated in FIG. 2. A mid-supply level 206 may be set at a halfway distance between logic high 202 and logic low 204. When a signal is said to be residing in a "high impedance state" its value may be indeterminate, and thus unpredictable. A high impedance state 208 is also shown in FIG. 2. In some embodiments, "encoding" a single signal may mean the generation of a set of one or more signals for the purpose of representing the signal to be encoded, and where the set of signals may be propagated in lieu of the single signal to be encoded. A signal is said to be "qualified" when it meets the validity requirements as set forth by a host system. A host system may be an ASIC. A signal that may assume a mid-supply level 206 or a high impedance state 208 in a digital host system during operations that are affected by the signal is generally considered not to meet the validity requirements of the digital host system. If a trigger signal routed to a digital host system exhibits the behavior illustrated in FIG. 2 during operations affected by the trigger signal, the trigger signal may be considered as one not meeting the validity requirements set forth by the digital host system. A given timing relationship between signals may be deemed "substantially invariant" with respect to a nominal timing relationship between the signals, insofar as a behavior (pertaining to a system using the signals) implied or predicted by the given timing relationship does not deviate from a behavior implied or predicted by the nominal timing relationship.

When referencing a pulse of a signal, a "leading edge" of the pulse is a first edge of the pulse, resulting from the value of the signal changing from a default value, and a "trailing edge" is a second edge of the pulse, resulting from the value of the signal returning to the default value. A "data-valid window" for a signal represents a time period during which the signal may be considered a valid digital signal. A first signal is said to be "corresponding" to a second signal if the first signal was generated in response to the second signal. When data is said to be "registered" or "latched" "using" a signal, the signal acts as a trigger signal that controls the storing of the data into the register or latch. In other words, when a signal "used" for registering or latching data is in its triggering state, the data residing at respective input ports of the register or latch is stored into the register or latch. Similarly, when data is latched "on the leading edge" or "on the trailing edge" of a pulse of a clock, the data residing at respective input ports of a register or latch is stored into the register or latch, respectively, when a leading edge or a trailing edge of a pulse of the clock occurs, respectively. A first signal is said to "propagated based on" a second signal, when the second signal controls the propagation of the first signal. Similarly, a first module is said to "use" a clock signal to transfer data to a second module, when propagation of the data from the first module to the second module is controlled and/or triggered by the clock signal.

The term "bus" is used to refer to a plurality of signals or conductors that may be used to transfer one or more of various types of information, such as data, addresses, control, or status. "Burst length" is used to refer to a number that indicates how many consecutive data bus transfers may be performed in response to a single bus transfer request sent by a host system. For example, if a burst length is four and a memory read operation is performed, there may be four consecutive sets of data transferred on the data bus in response to a single read signal pulse sent by a host system. The size of a set of data for a single transfer over a data bus is typically commensurate with the size of the data bus. Common burst lengths for a DDR SDRAM may include the values of two, four or eight.

Figure 3:
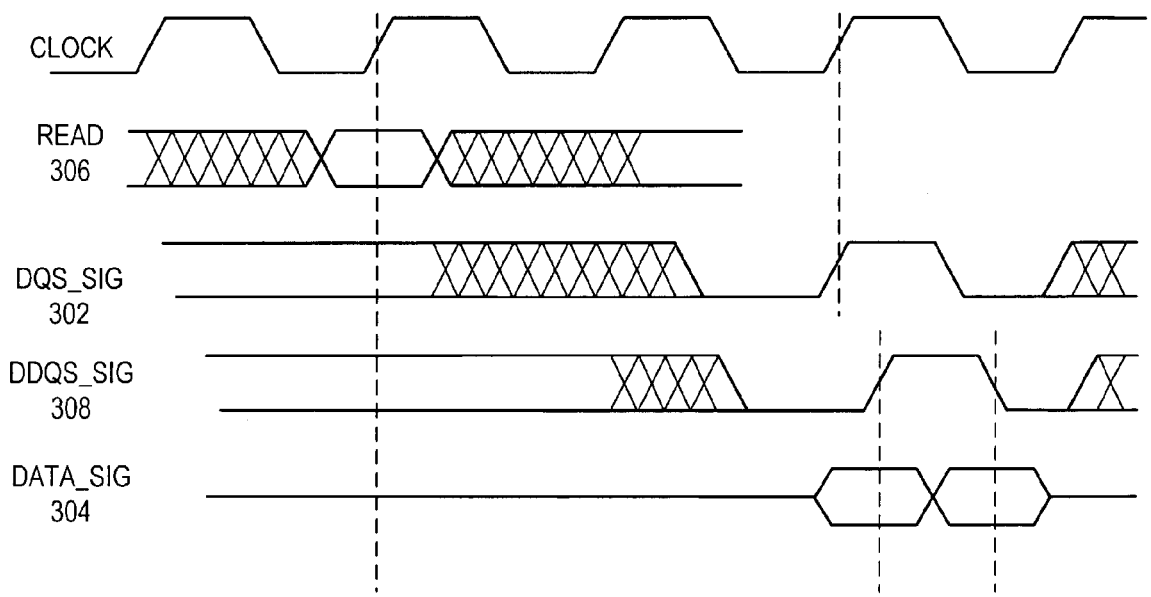
FIG. 3 illustrates a timing relationship between a read signal, a DQS signal, a delayed version of the DQS signal, and a data bus signal during a DDR SDRAM read operation in accordance with prior art.

According to prior art, a read operation for a DDR SDRAM may be performed as follows. A host system, which may be an ASIC that may include a DDR SDRAM controller and an interface unit, sends out a single Read request. The DDR SDRAM receives the Read request through a set of control signals. A predetermined number of clock cycles after having received the Read request, the DDR SDRAM sends a predetermined number of consecutive DQS signal pulses back to the host system. The predetermined number of clock cycles may be referred to as "CAS latency", where CAS stands for "Column Address Strobe". The number of consecutive DQS signal pulses may be commensurate with one half the value of a predetermined burst length for the read operation. The DDR SDRAM also sends a predetermined number of sets of data to the host system, where the number may be commensurate with the value of the predetermined burst length for the read operation. A timing relationship between a Read request (READ) 306, a DQS signal (DQS_SIG) 302, the DQS signal delayed by a quarter clock cycle (DDQS_SIG) 308 and data signal (DATA_SIG) 304 for the read operation is shown in FIG. 3, wherein for the purposes of illustration the burst length and the CAS latency have both been assigned a value of two.

Figure 4:
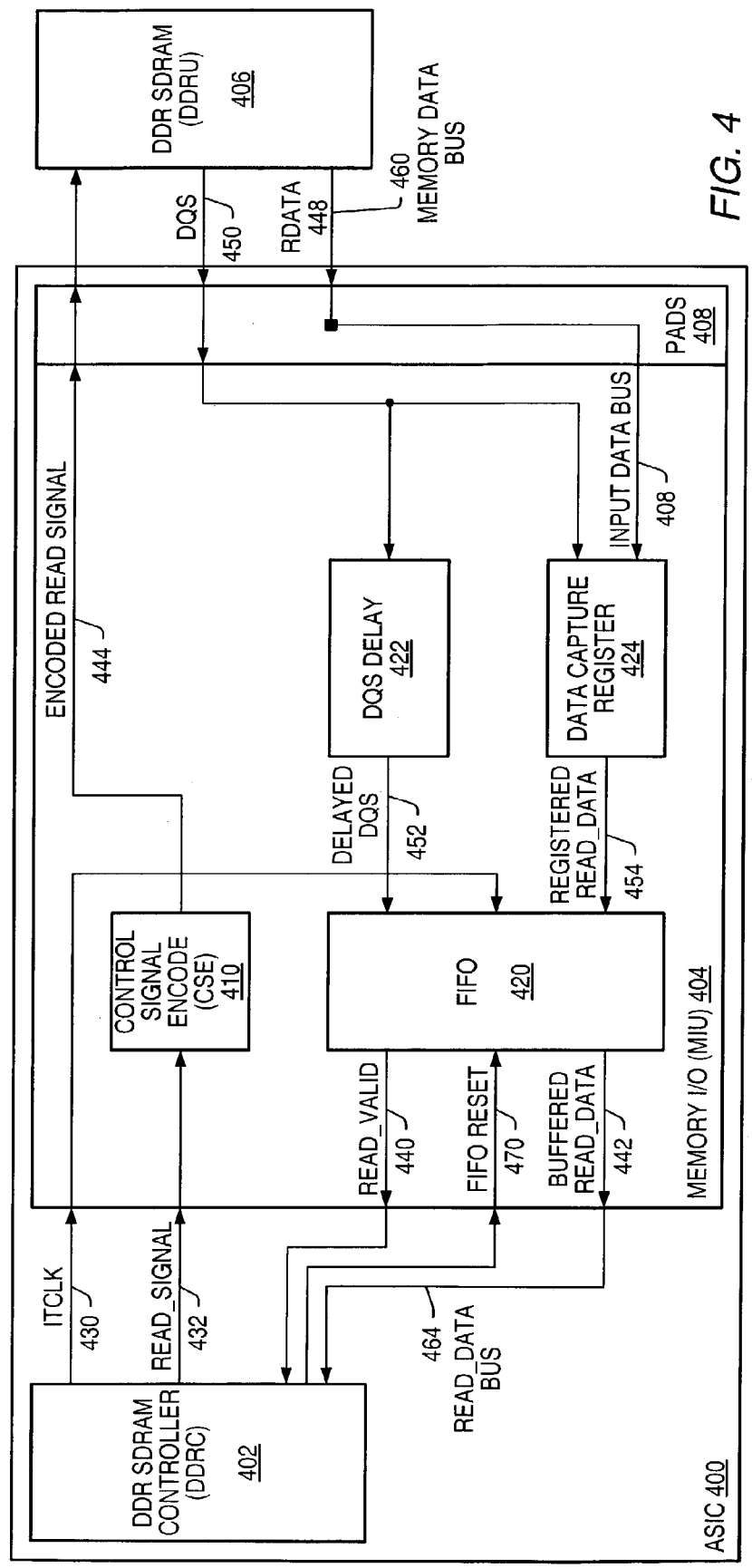
FIG. 4 illustrates a DDR SDRAM system with an interface unit implemented in accordance with one set of embodiments of the present invention.

FIG. 4 illustrates part of a DDR SDRAM system that includes a Memory I/O implemented in accordance with one set of embodiments of the present invention. In this set of embodiments, the DDR SDRAM system comprises a DDR SDRAM Controller (DDRC) 402, a Memory I/O unit (MIU) 404, and a DDR SDRAM unit (DDRU) 406, where DDRC 402 is coupled to DDRU 406 through MIU 404, and a set of pad circuits (PADS) 408 couples MIU 404 to DDRU 406. A Read signal 432 generated by DDRC 402 may be connected to MIU 404, and a DQS signal 450 generated by DDRU 406 may also be connected to MIU 404. A clock signal (ITCLK) 430 provided by DDRC 402 may also connected to MIU 404. DDRC 402 may be a part of a Host ASIC (ASIC) 400. MIU 404 may also be embedded on ASIC 400. In one embodiment, MIU 404 contains a Control Signal Encode block (CSE) 410, a First-In First-Out buffer (FIFO) 420, a Data Capture Register (DCR) 424, and a DQS Delay block (DDB) 422. Read signal 432 may be connected to CSE 410 to generate an encoded version of Read signal 432 (ENC_READ) 444, where ENC_READ 444 may be routed to DDRU 406 from MIU 404 through PADS 408.

In one embodiment, DDRU 406 is coupled to MIU 404 through PADS 408 via a Memory Data Bus (MDB) 460 carrying read data (RDATA) 448. MDB 460 may be coupled to an Input Data Bus (IDB) 462 inside PADS 408, and IDB 462 may be coupled DCR 424 where RDATA 448 may be transferred from MDB 460 to IDB 462 and carried to DCR 424 via IDB 462. DDRU 406 may also generate a DQS signal (DQS) 450. In one embodiment, DQS 450 is coupled to MIU 404 through PADS 408, where it is connected to DDB 422 and DCR 424. In this embodiment, DCR 424 uses DQS 450 as a trigger signal, or clock signal, for latching and capturing RDATA 448, and consequently provides a registered version of RDATA 448 (RRDATA) 454 as an output. FIFO 420 may be used as a buffer to hold the incoming RRDATA 454, and to make the buffered RRDATA 454 (BDATA) 442 available to DDRC 402. When transferring BDATA 442 to DDRC 402, FIFO 420 may use ITCLK 430, which would, in such a case, be coupled to FIFO 420.

Figure 6:
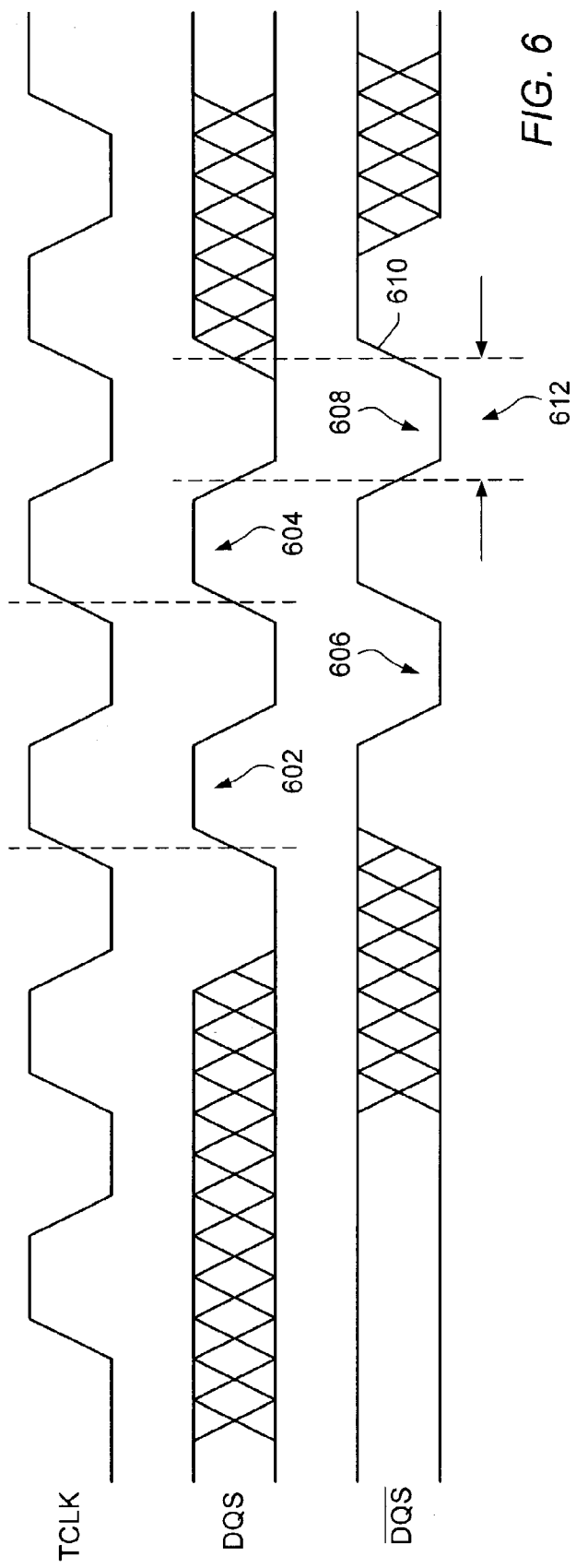
FIG. 6 illustrates a timing relationship between a free-running clock, a DQS signal, and a delayed and inverted DQS signal.

In one embodiment, ITCLK 430 is a free-running clock while DQS 422 is not. In this embodiment, DQS 422 is delayed by a time period that may be commensurate with one-half cycle of ITCLK 430, resulting in a delayed DQS (DDQS) 452, in order to provide a clock edge for the FIFO 420 to latch RRDATA 454. BDATA 442 may be sent to DDRC 402 via a Read-Data Bus (RDB) 464, which couples DDRC 402 to FIFO 420. A read-valid signal (READ_VALID) 440 may also be provided to DDRC 402 by FIFO 420 to indicate when valid BDATA is available, and DDRC 402 may reset FIFO 420 through a reset signal (FRESET) 470, which is connected between DDRC 402 and FIFO 420. FIG. 6 illustrates a timing relationship between ITCLK 430, DQS 450, and an inverted DDQS 452. As shown, pulses 606 and 608 of the inverted DDQS 452 correspond to pulses 602 and 604 of DQS 450, and edge 610 may be used by FIFO 420 to latch RRDATA 454.

Figure 5:
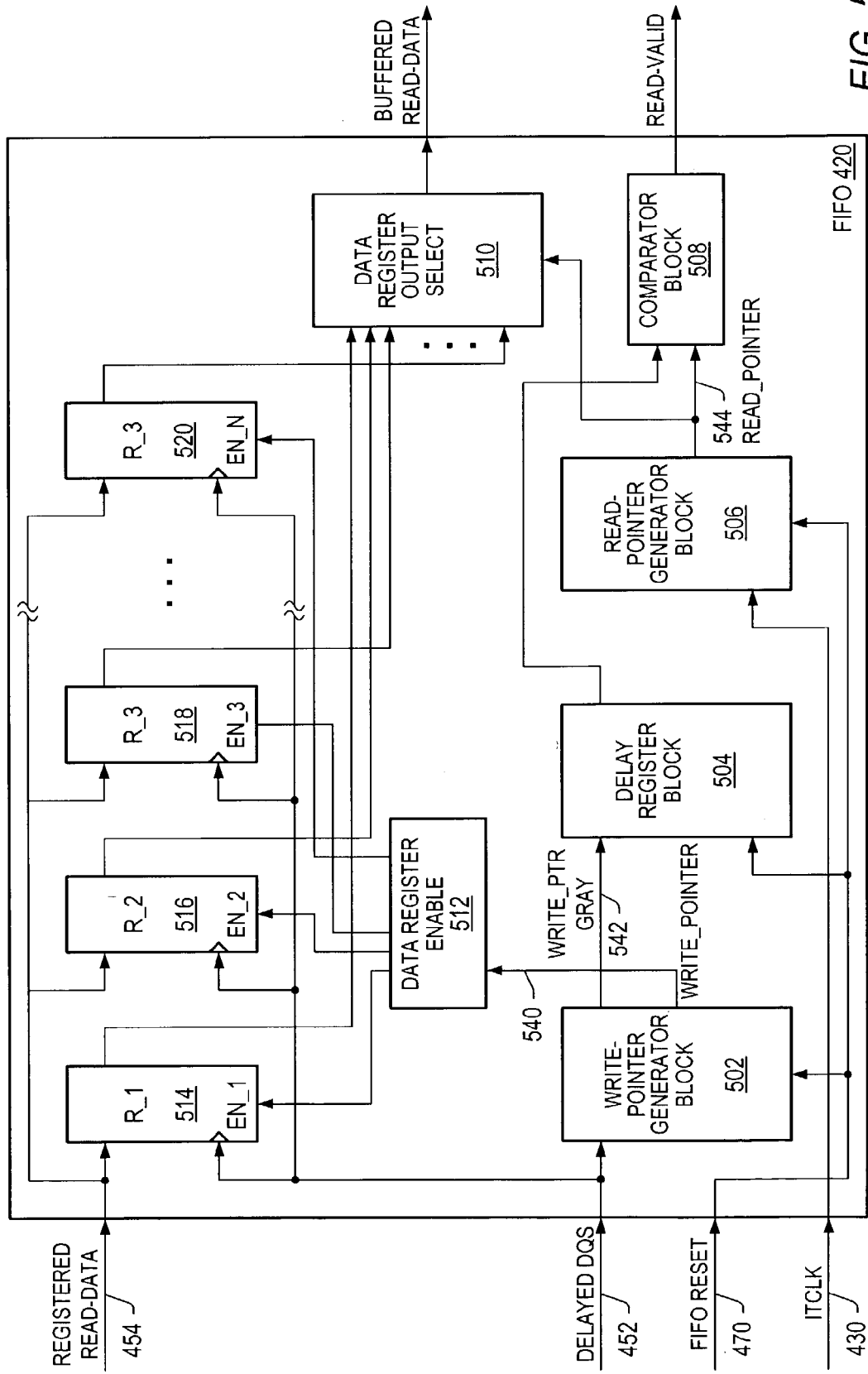
FIG. 5 illustrates a FIFO implemented in accordance with one set of embodiments of the current invention.

FIG. 5 illustrates one embodiment of FIFO 420. In this embodiment, a set of N flip-flops (R1 514, R2 516, R3 518 . . . RN 520) comprise a buffer of N stages, with RRDATA 454 connected to respective inputs of each flip-flop in the set. The flip-flops may use DDQS 452 as a clock signal to latch RRDATA. DDQS 452 may also serve as a clock input to a Write Pointer Generator block (WPGB) 502. In one embodiment, WPGB 502 generates a Write Pointer signal (WP) 540, which is output to a Data Register Enable circuit (DRE) 512. A respective output of DRE 512 may be connected to a respective enable input of a flip-flop, for each flip-flop in the set of flip-flops, resulting in one flip-flop being selected at a time for the purpose of storing the current value of RRDATA 454. WPGB 502 may also generate a gray-code Write Pointer signal (GWP) 542. Successive values of GWP 542, when represented in a binary number format, may differ from each other by no more than a single bit. GWP 542 may be connected to a Delay Register block (DRB) 504, which may use ITCLK 430 as a clock signal to latch and/or transfer data. An output of DRB 504 may then become one input of a Comparator Block (CB) 508. Another input of CB 508 may be a Read Pointer signal (RP) 544. In one embodiment, RP 544 is generated by a Read Pointer Generator block (RPGB) 506, which also uses ITCLK 430 as a clock signal to latch and/or transfer data. One purpose for using GWP 542 and DRB 504 may be to allow enough time for signals to meet set-up and hold-time requirements when crossing from one clock domain (DDQS 452) to another clock domain (ITCLK 430).

Respective outputs of R1 514, R2 516, R3 518 . . . RN 520 may feed into respective inputs of a Data Register Output Select block (DROS) 510, which may use RP 544 to select which flip-flop output is selected as BDATA 442. In summary, write operations to FIFO 420 may occur on triggering edges of DDQS 452 and may involve R1 514, R2 516, R3 518 . . . RN 520, WPGB 502, and DRE 512. Read operations from FIFO 420 may occur on triggering edges of ITCLK 430 and may involve DRB 504, RPGB 506, CB 508, and DROS 510. In such a scenario, the write operations and read operations take place in different clock domains, therefore RRDATA 454 crosses clock domains inside FIFO 420, from DDQS 452, which may be a non-free-running clock, to ITCLK 430, which may be a system clock of ASIC 400 of which DDRC 402 may be a part.

Figure 7:
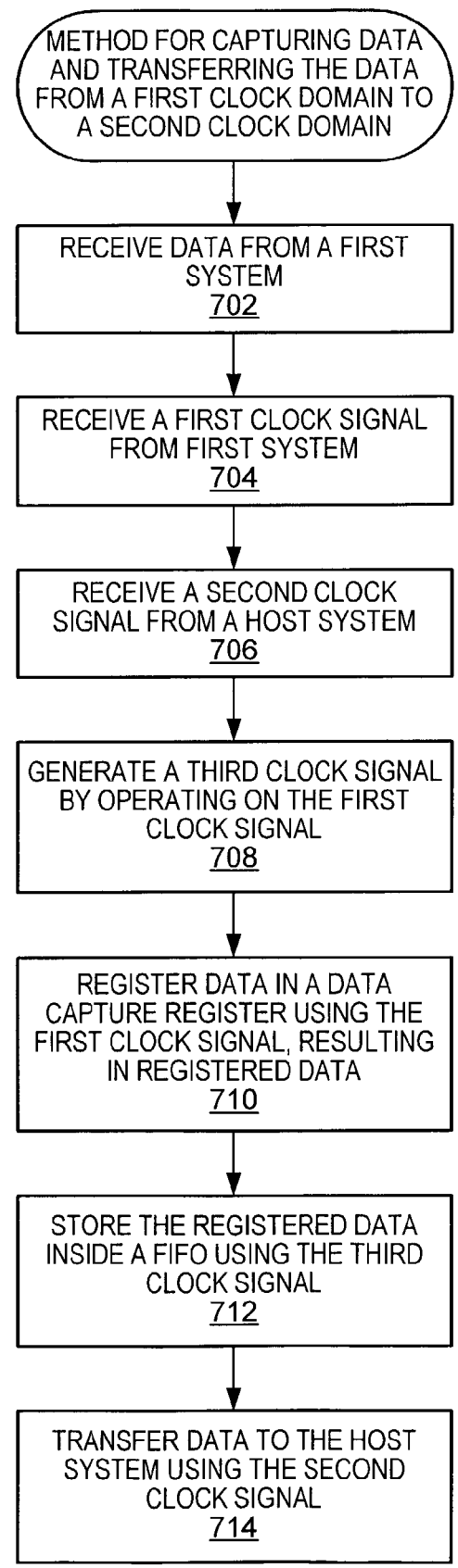
FIG. 7 illustrates part of a method for capturing and transferring data from a first clock domain to a second clock domain.

FIG. 7 illustrates part of a method for capturing and transferring data from a first clock domain to a second clock domain, when a clock representing the first clock domain may not be a free-running clock. Data is received from a first system (702) as well as a first clock signal (704). A second clock signal is received from a host system (706), and a third clock is generated by operating on the first clock signal (708). In one embodiment, the first system is a DDR SDRAM memory unit, data is read-data, and the first clock signal is a DQS signal generated by the DDR SDRAM memory unit. In this embodiment, the third clock signal is a delayed version of the DQS signal, where DQS may be delayed by one-half cycle of the second clock signal. The second clock may be a system clock of the host system, which may be part of an ASIC.

As shown in 710, the data is registered in a data capture register using the first clock signal, which results in registered data. The registered data is stored in a buffer using the third clock signal to latch/transfer the data, resulting in buffered data (712). The buffered data is transferred to the host system using the second clock signal as a trigger signal. In one embodiment, the buffer is a FIFO, and the data crosses clock domains inside the FIFO when transferred to the host system. The first clock signal may be a non-free-running clock, while the second clock signal may be a free-running clock.

Thus, various embodiments of the systems and methods described above may facilitate the capture and transfer of data, such as read-data from a DDR SDRAM memory unit, from a first clock domain, such as a clock domain represented by a DQS signal in a DDR SDRAM system, to a second clock domain, such as a clock domain represented by a system clock of an ASIC. The data may be registered using the first clock, then buffered in what may be a FIFO using a delayed version of the first clock, and finally transferred to a host system utilizing a second clock that may be a system clock of the host system. The design of the FIFO and the provision of the delayed first clock allow for a successful crossing of the clock domains even in the event the first clock is not a free-running clock.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A system comprising:
an interface unit;
a first module; and
a second module;
wherein the first module is coupled to the second module through the interface unit;
wherein the interface unit includes a data capture register coupled to a data buffer;
wherein the interface unit is operable to receive, from the second module, data and a first clock signal;
wherein the interface unit is further operable to generate a second clock signal by delaying the first clock signal;
wherein the data capture register is operable to latch the data using the first clock signal, resulting in registered data;
wherein the data buffer is operable to latch the registered data using the second clock signal, resulting in buffered data;
wherein the first clock signal is not a free-running clock signal;
wherein the data buffer is operable to provide the buffered data to the first module; and
wherein the first module and the second module operate in different clock domains.

2. The system of claim 1, wherein the first module and the interface unit are embedded on the same integrated circuit.

3. The system of claim 1, wherein, in delaying the first clock signal, the interface unit is operable to delay the first clock signal by a specified latency.

4. The system of claim 3, wherein the specified latency is one-half cycle of the first clock.

5. The system of claim 3, wherein the specified latency is very close to one-half cycle of the first clock.

6. The system of claim 3;
wherein the interface unit further includes a delay element; and
wherein the interface unit is operable to use the delay element in delaying the first clock signal.

7. The system of claim 1, wherein the data capture register comprises a first set of flip-flops and a second set of flip-flops.

8. The system of claim 7;
wherein a first portion of the data is coupled to respective input ports of the first set of flip-flops; and
wherein the first set of flip-flops are operable to latch the first portion of the data on a leading edge of a pulse of the first clock.

9. The system of claim 7;
wherein a second portion of the data is coupled to respective input ports of the second set of flip-flops; and
wherein the second set of flip-flops are operable to latch the second portion of the data on a trailing edge of a pulse of the first clock.

10. The system of claim 7, wherein the registered data is latched into the data buffer on a trailing edge of a pulse of the second clock.

11. The system of claim 1;
wherein the interface unit is further operable to receive a third clock signal from the first module; and
wherein the data buffer is operable to receive the third clock signal.

12. The system of claim 11, wherein the data buffer is operable to transfer the buffered data to the first module using the third clock signal.

13. The system of claim 12, wherein the data buffer is a FIFO.

14. The system of claim 13, wherein the FIFO comprises:
a plurality of data registers;
a write-pointer generator block and a read-pointer generator block both coupled to a comparator block;
a data register enable block; and
a data register output select block;
wherein the registered data is coupled to respective input ports of each of the plurality of data registers;
wherein a respective output port of each of the plurality of data registers is coupled to a respective input port of the data register output select block;
wherein an output port of the read-pointer generator block is coupled to a select-input port of the data register output select block;

wherein the write-pointer generator block is coupled to the data register enable block; and wherein each one of a plurality of output ports of the data register enable block is coupled to a respective enable input port of a respective data register of each of the plurality of data registers.

15. The system of claim 14, wherein the comparator block is operable to generate a read-valid signal.

16. The system of claim 14;
wherein the write-pointer generator block is operable to receive the second clock signal; and
wherein operations of the write-pointer block are triggered by the second clock signal.

17. The system of claim 14;
wherein the read-pointer generator block is operable to receive the third clock signal; and
wherein operations of the read-pointer generator block are triggered by the third clock signal.

18. The system of claim 14;
wherein the FIFO further comprises a delay register block;
wherein an output port of the write-pointer generator block is coupled to a respective input port of the delay register block; and
wherein an output port of the delay register block is coupled to a respective input port of the comparator block.

19. A method for capturing data and transferring the data from a first clock domain to a second clock domain, the method comprising:
an interface unit receiving data;
the interface unit receiving a first clock signal;
the interface unit receiving a second clock signal from a host system;
the interface unit generating a third clock signal by operating on the first clock signal;
a data capture register inside the interface unit latching the data using the first clock signal, resulting in registered data;
a data buffer inside the interface unit latching the registered data using the third clock signal, resulting in buffered data; and
the data buffer using the second clock signal to transfer the buffered data to the host system;
wherein the first clock signal is not a free-running clock signal; and
wherein the first clock signal and the second clock signal represent two different clock domains.

20. The method of claim 19, wherein said operating on the first clock signal comprises delaying the first clock signal by a specified latency.

21. The method of claim 20, wherein the specified latency is one-half cycle of the first clock.

22. The method of claim 20, wherein the specified latency is very close to one-half cycle of the first clock.

23. The method of claim 19;
wherein the data is received from a second system; and
wherein the first clock signal is received from the second system.

24. The method of claim 19, wherein the data capture register comprises a first set of flip-flops and a second set of flip-flops.

25. The method of claim 24, wherein said latching the data using the first clock signal comprises the first set of flip-flops latching a first portion of the data using a leading edge of a pulse of the first clock.

26. The method of claim 24, wherein said latching the data using the first clock signal comprises the second set of flip-flops latching a second portion of the data using a trailing edge of a pulse of the first clock.

27. A system for capturing data and crossing clock domains, the system comprising:
a data capture register;
a data buffer; and
a clock modifier block;
wherein the data capture register and the clock modifier block are coupled to the data buffer;
wherein the data capture register is operable to receive read-data and a first clock signal, and latch the read-data using the first clock signal, resulting in registered read-data;
wherein the clock modifier block is operable to receive the first clock signal and generate a second clock signal by operating on the first clock signal;
wherein the data buffer is operable to receive the second clock signal and latch the registered read-data using the second clock signal, resulting in buffered read-data;
wherein the first clock signal is not a free-running clock signal;
wherein the data buffer is further operable to receive a third clock signal and transfer the buffered read-data to a receiving module coupled to the system, using the third clock signal;
wherein the receiving module provides the third clock signal; and
wherein the first clock signal and the second clock signal represent different clock domains.

28. The system of claim 27, wherein the system is part of a Memory I/O.

29. The system of claim 28, wherein a memory module provides the read-data and the first clock signal.

30. The system of claim 29, wherein the memory module is a DDR SDRAM.

31. The system of claim 30, wherein the first clock signal is a DQS signal.

32. The system of claim 27, wherein the receiving module is a memory controller.

33. The system of claim 32, herein the memory controller is a DDR SDRAM controller.

34. The system of claim 33, herein the first clock signal is a DQS signal.

35. The system of claim 27, wherein the system and the receiving module are embedded on the same integrated circuit.

36. The system of claim 27, wherein the data buffer is a FIFO.

37. The system of claim 36, herein the FIFO comprises:
a plurality of data registers;
a write-pointer generator block and a read-pointer generator block both coupled to a comparator block;
a data register enable block; and
a data register output select block;
wherein the registered data is coupled to respective input ports of each of the plurality of data registers;
wherein a respective output port of each of the plurality of data registers is coupled to a respective input port of the data register output select block;
wherein an output port of the read-pointer generator block is coupled to a select-input port of the data register output select block;
wherein the write-pointer generator block is coupled to the data register enable block; and wherein each one of a plurality of output ports of the data register enable block is coupled to a respective enable input port of a respective data register of each of the plurality of data registers.

38. The system of claim 37, herein the comparator block is operable to generate a read-valid signal.

39. The system of claim 37;

wherein the write-pointer generator block is operable to receive the second clock signal; and wherein operations of the write-pointer block are triggered by the second clock signal.

40. The system of claim 37;

wherein the read-pointer generator block is operable to receive the third clock signal; and wherein operations of the read-pointer generator block are triggered by the third clock signal.

41. The system of claim 37;

wherein the FIFO further comprises a delay register block;

wherein an output port of the write-pointer generator block is coupled to a respective input port of the delay register block; and wherein an output port of the delay register block is coupled to a respective input port of the comparator block.

* * * * *

UNITED STATES PATENT AND TRADEMARK OFFICE
CERTIFICATE OF CORRECTION

| | | |
|---|---|---|
| PATENT NO. | : 7,184,508 B2 | Page 1 of 1 |
| APPLICATION NO. | : 10/327727 | |
| DATED | : February 27, 2007 | |
| INVENTOR(S) | : Emberling | |

It is certified that error appears in the above-identified patent and that said Letters Patent is hereby corrected as shown below:

Column 10 Line 42, please delete "The system of claim 32, herein the memory controller" and substitute -- The system of claim 32, wherein the memory controller --;

Column 10 Line 44, please delete "The system of claim 33, herein the first clock signal" and substitute -- The system of claim 33, wherein the first clock signal --;

Column 10 Line 51, please delete "The system of claim 36, herein the FIFO comprises:" and substitute --The system of claim 36, wherein the FIFO comprises: --;

Column 11 Line 5, please delete "The system of claim 37, herein the comparator block" and substitute -- The system of claim 37, wherein the comparator block --.

Signed and Sealed this

Eighth Day of May, 2007

JON W. DUDAS
*Director of the United States Patent and Trademark Office*